United States Patent [19]

Shimazu et al.

[11] Patent Number: 4,777,623
[45] Date of Patent: Oct. 11, 1988

[54] SEMICONDUCTOR MEMORY DEVICE HAVING INITIALIZATION TRANSISTOR

[75] Inventors: Yukihiko Shimazu; Eiichi Teraoka, both of Itami, Japan

[73] Assignee: Mitsubishi Denki Kabushiki Kaisha, Tokyo, Japan

[21] Appl. No.: 869,653

[22] Filed: Jun. 2, 1986

[30] Foreign Application Priority Data

Jun. 6, 1985 [JP] Japan ................... 60-123560

[51] Int. Cl.$^4$ ................ G11C 7/00; G11C 11/40
[52] U.S. Cl. .................... 365/154; 365/189; 365/190; 307/571
[58] Field of Search .......... 365/190, 189, 154; 307/571, 575

[56] References Cited

U.S. PATENT DOCUMENTS

| | | | |
|---|---|---|---|
| 3,753,011 | 8/1973 | Faggin | 307/247.1 |
| 4,380,055 | 4/1983 | Larson | 365/154 |
| 4,441,168 | 4/1984 | Luciw | 365/190 X |
| 4,460,978 | 7/1984 | Jiang et al. | 365/154 |
| 4,484,310 | 11/1984 | Everett et al. | 365/154 X |
| 4,499,560 | 2/1985 | Brice | 365/154 X |
| 4,594,688 | 6/1986 | Uno | 365/154 X |
| 4,635,229 | 1/1987 | Okumura et al. | 365/154 |

FOREIGN PATENT DOCUMENTS 0080394 4/1985 European Pat. Off. .
3330026 2/1985 Fed. Rep. of Germany .

OTHER PUBLICATIONS

Lee et al., "Control Logic and Cell Design for a 4K NVRAM" *IEEE Journal of Solid-State Circuits* SC-18, No. 5 (Oct. 1983): 525–532.

Chao, "Static RAM with Nonvolatile Backup Memory", *IBM Technical Disclosure Bulletin* vol. 24, No. 5 (Oct. 1981) 2456–2457.

Texas Instruments specification sheet for a Dual D-Type Positive-Edge-Triggered Flip-Flops with Clear and Preset.

*Primary Examiner*—Stuart N. Hecker
*Assistant Examiner*—Alyssa H. Bowler
*Attorney, Agent, or Firm*—Lowe, Price, Leblanc, Becker & Shur

[57] ABSTRACT

A memory circuit 14 comprises a MOS transistor 15 having its threshold voltage selected to be higher than the output voltage on the occasion of the ordinary operation. Consequently, the MOS transistor 15 is off on the occasion of the ordinary operation, and a ratio latch 4 performs the ordinary storing operation. Meanwhile, if the output voltage of the power source 12 is raised, the MOS transistor 15 turns on to pull down the potential of a data input line 6a to the ratio latch. Accordingly, the ratio latch 4 is forced to be set.

13 Claims, 5 Drawing Sheets

SEMICONDUCTOR MEMORY DEVICE HAVING INITIALIZATION TRANSISTOR

BACKGROUND OF THE INVENTION

1. Field of the Invention

The present invention relates to a semiconductor memory device, and particularly to an improvement of a semiconductor memory device having a setting or resetting initialization function.

2. Description of Prior Art

FIG. 1 is a schematic diagram of one example of a conventional semiconductor memory device having a setting initialization function. A memory circuit 1 comprises a so-called ratio latch 4 formed of two inverters 2 and 3, a setting MOS transistor 5 for setting the ratio latch 4 forcedly, a data input terminal 6, a set signal input terminal 7, and a data output terminal 8. The data input terminal 6 is provided with input data through a driver 9 and a gate MOS transistor 10. The gate MOS transistor 10 has its on or off controlled by a clock signal CLK. Accordingly, the data is inputted synchronously with the clock signal CLK. The inputted data is applied to the ratio latch 4 through a data input line 6a. On the other hand, a set initialization signal is applied to the set signal input terminal 7 externally through a set initialization signal input line 7a. The inputted set initialization signal is applied to a gate of the setting MOS transistor 5. The setting MOS transistor 5 is interposed between the data input line 6a and the ground. The ratio latch 4 is composed of inverters 2 and 3; the former receives the data inputted from the data input line 6a at its input end, and the latter inverts the output from the inverter 2 and feeds it back to the input end of said inverter 2. The output from the inverter 2 is applied to the data output terminal 8. The output data of the memory circuit 1 is withdrawn from the data output terminal 8.

Now, the operation of the circuit shown in FIG. 1 will be described. The ratio latch 4 stores the logic "1" or "0" corresponding to the data inputted synchronously with the clock signal CLK. When the ratio latch 4 stores the logic "1", it provides an output data of "H" level; when it stores the logic "0", it provides an output data of "L" level. On this occasion, if a set initialization signal is inputted externally, the setting initialization MOS transistor 5 is turned on. Accordingly, the potential of the data input line 6a is pulled down to the ground potential and, therefore, the ratio latch 4 is forced to be set to be in the state of storing the logic "1". Thereafter, even if data is inputted from the data input terminal 6, the set state is maintained, as the potential of the input terminal of the inverter 2 is fixed on the ground potential.

FIG. 2 is a schematic diagram of one example of a conventional semiconductor memory device having a resetting initialization function. In the figure, the memory device 1' comprises, instead of the setting initialization MOS transistor 5, the set initialization signal input terminal 7 and the set initialization signal input line 7a, which are included in the memory circuit 1 of FIG. 1, a resetting initialization MOS transistor 11, a reset initialization signal input terminal 13, and a reset initialization signal input line 13a. The resetting initialization MOS transistor 11 is interposed between the data input line 6a and a power source 12. A reset initialization signal is applied to the gate electrode of the resetting initialization MOS transistor 11 externally through the reset initialization signal input terminal 13.

In the circuit shown in FIG. 2 having the above described structure, the resetting initialization MOS transistor 11 is turned on when the reset initialization signal is inputted, and the potential of the data input line 6a is pulled up to the source potential. Therefore, the ratio latch 4 is forced to be reset to be in a state storing the logic "0". Thereafter, the ratio latch 4 maintains the reset initialization state, even if an input data is inputted from the data input terminal 6.

In a memory circuit having a setting or resetting function to initialize the memory circuit composed as described above, a terminal 7 or 13 used only for inputting a set or reset initialization signal is required and, in addition, the wiring of a set or reset initialization signal input line 7a or 13a for inputting a set signal or a reset initialization signal from outside in an integrated circuit is necessary. These are causes obstructing implementation of a larger scale integration.

Although in FIGS. 1 and 2 description was given with regard to the case where a ratio latch was used as a memory circuit for performing the storing operation, the same problem as described above will arise even in the case where a flip-flop or the like is used.

SUMMARY OF THE INVENTION

Therefore, it is an object of this invention to provide a semiconductor memory device which requires neither a signal line nor a terminal for the exclusive use of setting or resetting.

Briefly stated, the present invention provides a semiconductor memory device operable in an operating mode which stores the logic "1" or "0" corresponding to the input data, comprising a data input terminal to which input data is applied, a logic circuit for performing a prescribed storing operation corresponding to the input data, a data output terminal for providing the output from the logic circuit, and a MOS transistor for setting or resetting the logic circuit to "1" or "0", respectively, and thereby initializing the logic circuit. The logic circuit has its storing state set or reset forcedly corresponding to the potential applied to an initializatin terminal thereof, and one conduction electrode of said MOS transistor is connected to the initialization terminal. The other conduction electrode of this MOS transistor is connected to a first or second reference potential source, and the gate electrode thereof is connected to a first or second reference potential source. The first reference potential source is a driving power source of said logic circuit, while the second reference potential source is a ground potential. The threshold voltage of said MOS transistor is selected to be higher than the output voltage of the driving power source on the occasion of the ordinary operation of the logic circuit.

In the present invention, since the MOS transistor has its threshold voltage selected to be higher than the output voltage of the driving power source during the ordinary operation of the logic circuit in an operational mode for storing data, the MOS transistor is non-conductive in the ordinary or operational mode and therefore, it has no effect on the logic circuit. When the voltage of the driving power source is made higher than the voltage of the operational mode, the MOS transistor is rendered conductive to pull down or pull up the potential at the given point of the logic circuit, thereby setting or resetting the storing state of the logic circuit compellingly.

Therefore, according to the present invention, a semiconductor memory device can be set or reset to initialize the memory device without the necessity of providing signal lines or terminals only for the purpose of applying a set or reset initialization signal. Consequently, the present invention can eliminate the causes obstructing implementation of a larger scale integration which were involved in a conventional semiconductor memory device.

These and other objects, features, and advantages of the present invention will be apparent from the following description of the preferred embodiments taken with the accompanying drawings.

DESCRIPTION OF PREFERRED EMBODIMENTS

Figure 1:
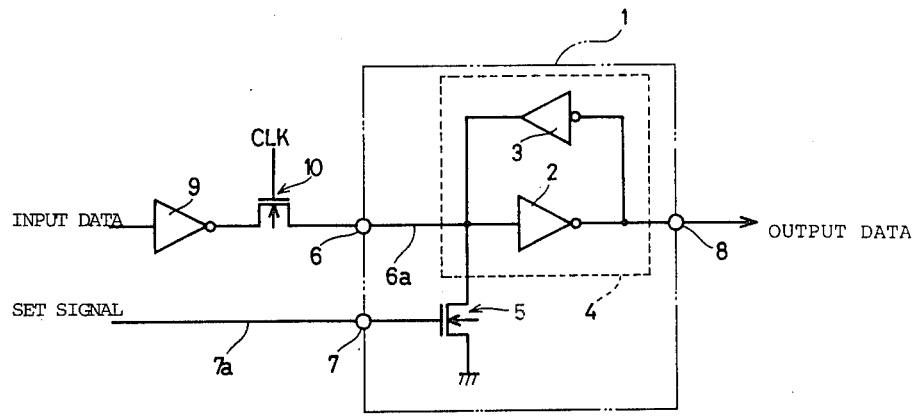
FIG. 1 is a schematic diagram of one example of a conventional semiconductor memory device having a setting initialization function.
Figure 2:
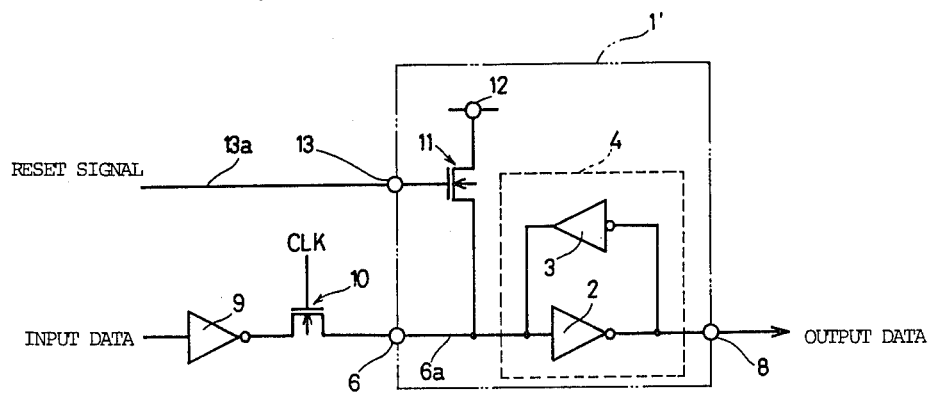
FIG. 2 is a schematic diagram of one example of a conventional semiconductor memory device having a resetting initialization function.
Figure 3:
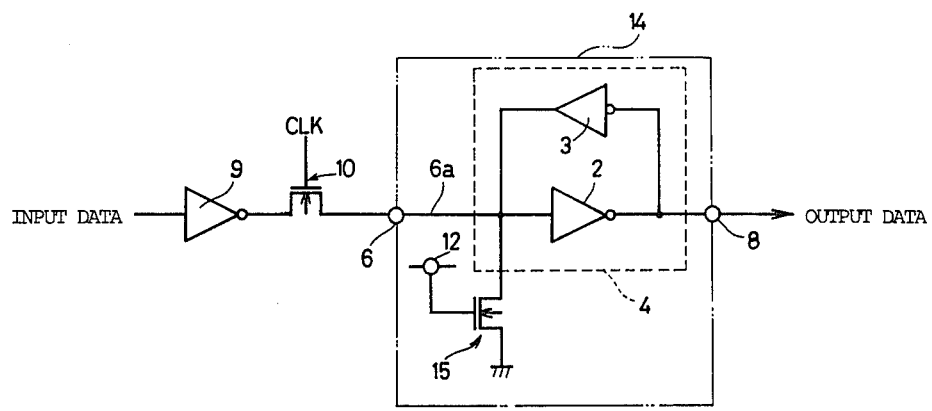
FIG. 3 is a schematic diagram of a semiconductor memory device according to one embodiment of this invention.

FIG. 3 is a schematic diagram showing a semiconductor memory device having a setting initialization function according to one embodiment of this invention. This embodiment in the figure has the same structure as the conventional circuit shown in FIG. 1 except the following points, and the corresponding parts are denoted by the same reference numerals and the description thereof will be omitted. In this embodiment, neither the set signal input terminal 7 nor the set signal input line 7a, which is provided in the circuit of FIG. 1, is provided. An N channel MOS transistor is interposed between the data input line 6a and the ground, and the gate electrode of this MOS transistor is connected to a power source 12. The substrate of the MOS transistor 15 is connected to the ground. Meanwhile, the power source 12 is a power source for driving the entire memory circuit 14, and the main portion of the power supply circuit is provided in the outside of the memory circuit 14. What is important is that the threshold voltage of the MOS transistor 15 is selected to be higher than the output voltage of the power source 12 on the occasion of the ordinary operation of the memory circuit 14.

Now, the operation of the embodiment shown in FIG. 3 will be described. On the occasion of the ordinary operation of the memory circuit 14, the MOS transistor 15 is in an off state since the threshold voltage of the MOS transistor 15 is higher than the output voltage of the power source 12. Consequently, the ratio latch 4 stores "0" or "1" according to the input data inputted synchronously with the clock signal CLK. On this occasion, if the output voltage of the power source is made higher than usual, the MOS transistor 15 turns on to pull down the data input line 6a of the ratio latch 4. Therefore, the ratio latch 4 is forced to be set.

As described above, in the embodiment of FIG. 3, the ratio latch 4 can be set by merely raising the output voltage of the power source 12 which is driving the memory circuit 14 higher than the output voltage at the ordinary operation. Accordingly, there is neither the necessity of wiring the set signal input line for transmitting a set initialization signal, nor the necessity of the set initialization signal input terminal, thereby enabling the implementation of a larger scale integration.

Meanwhile, the switching of the output voltage of the power source 12 is readily performed by forming a power supply circuit (not shown) provided in the outside of the memory circuit 14 in such a way that it could output two different voltages.

As for the MOS transistor 15, such a device as having sufficient driving capability to pull down the level of the input data line to "0" even when the input data is "1" may be used.

Figure 4:
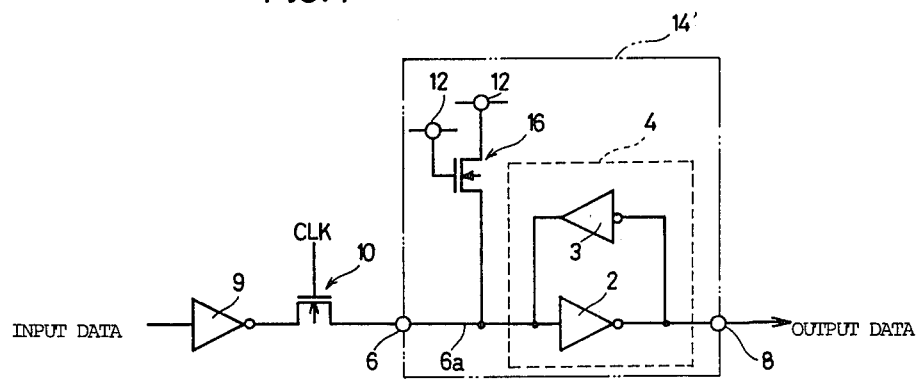
FIGS. 4–7 are schematic diagrams of semiconductor memory devices according to other embodiments of this invention.

FIG. 4 is a schematic diagram of a semiconductor memory device according to another embodiment of this invention, and more particularly, it shows one having a resetting initialization function. This embodiment is characterized in that an N channel MOS transistor 16 is interposed between the power source 12 and the data input line of the ratio latch 4, and that the power source 12 is connected to the gate electrode thereof. Otherwise, the struture is the same as that of the embodiment shown in FIG. 3 and the corresponding portions are denoted by the same reference characters. Meanwhile, the substrate of the MOS transistor 16 is connected to the ground, and the threshold voltage thereof is selected to be higher than the output voltage of the power source 12 on the occasion of the ordinary operation of the memory circuit 14'.

Next, the operation of the embodiment of FIG. 4 will be described. On the occasion of the ordinary operation of the memory circuit 14', the MOS transistor 16 is in an off state since the threshold voltage of the MOS transistor 16 is higher than the output voltage of the power source 12. Therefore, the ratio latch 4 stores "0" or "1" according to the input data. On this occasion, if the output voltage of the power source 12 is raised, the MOS transistor 16 turns on to pull up the potential of the data input line 6a. Consequently, the ratio latch 4 is forced to be reset. Therefore, this embodiment requires neither reset signal input line 13a nor reset signal input terminal 13 and the same effect as in the embdiment of FIG. 3 can be obtained.

As for the MOS transistor 16, such a device as having sufficient driving capability to pull up the potential of the data input line 6a to "1" even when the input data is "0" may be used.

Figure 5:
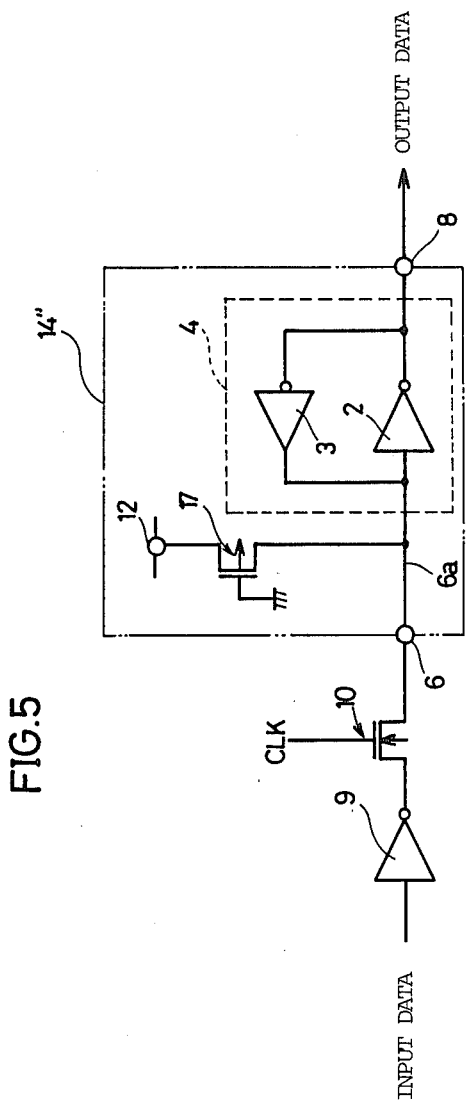

It is a matter of course that although an N channel transistor is used as a MOS transistor for setting or resetting in the embodiments of FIGS. 3 and 4, a P channel MOS transistor may be used. FIG. 5 shows an embodiment employing a P channel transistor as the resetting MOS transistor. As shown in the figure, this embodiment is characterized in that a P channel MOS transistor 17 is interposed between the data input line 6a and the power source 12, and that the gate electrode thereof is connected to the ground. The MOS transistor 17 has its substrate connected to the power source 12 and its threshold voltage selected to be higher than the output voltage of the power source 12 on the occasion of the ordinary operation of a memory circuit 14".

Now, the operation of the embodiment shown in FIG. 5 will be described. During of the ordinary operation of the memory circuit 14" in its operating mode, the MOS transistor 17 is in an off state, and the ratio latch 4 performs the storing operation according to the input data. When the output voltage of the power source 12 is raised, the potential of the data input line 6a is pulled up, and the ratio latch is forced to initialize and be reset.

Although a ratio latch 4 was used as a logic circuit for performing the storing operation in the embodiments shown in FIGS. 3–5 as described above, it is a matter of course that a flip-flop may be used as an alternative.

Figure 6:
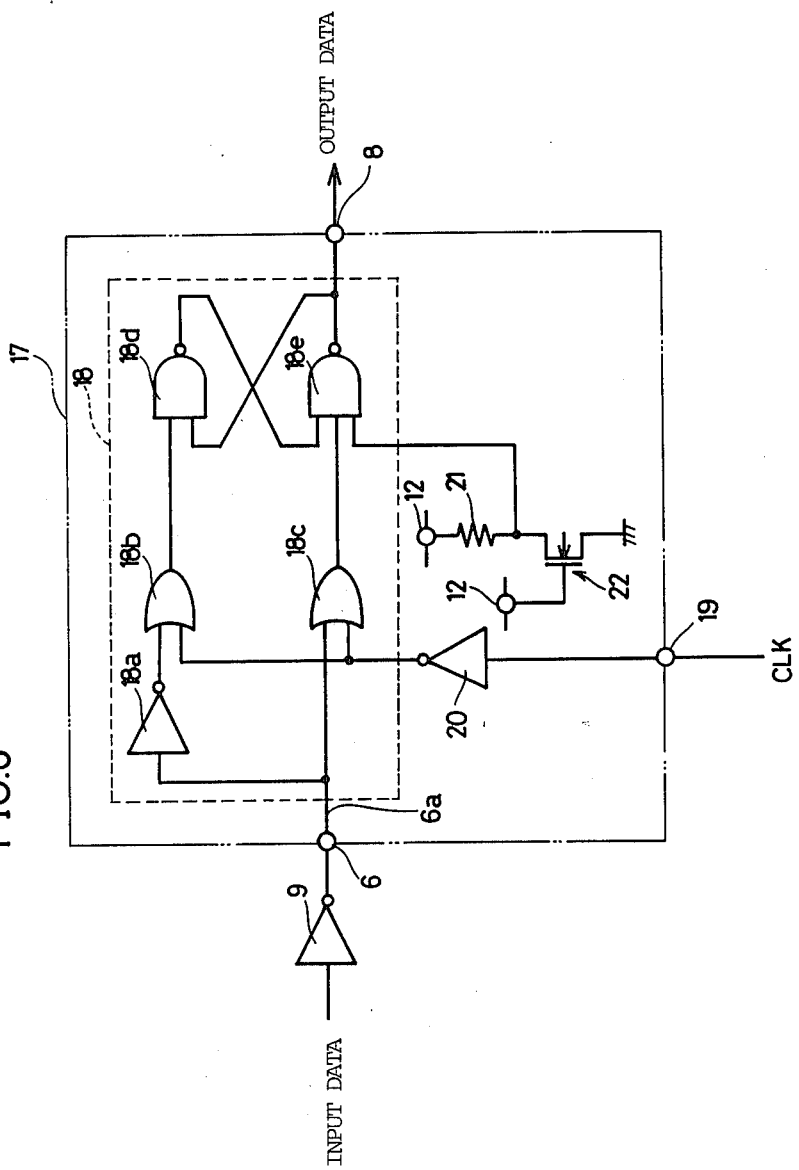

FIG. 6 is a schematic diagram of one embodiment employing a D type flip-flop as a logic circuit. Referring to the figure, the input data is applied to the data input terminal 6 of the memory circuit 17 through a driver 9. The input data from the data input terminal 6 is applied to the D type flip-flop 18 through the data input line 6a. The D type flip-flop 18 is composed of an inverter 18a, two OR gates 18b and 18c and two NAND gates 18d and 18e. That is, the input data from the data input line 6a is applied to one input end of the OR gate 18b through the inverter 18a as well as to one input end of the OR gate 18c directly. A clock signal CLK inputted from a clock signal input terminal 19 is applied to the other input ends of these OR gates 18b and 18c through an inverter 20. The output from the OR gate 18b is applied to one input end of the NAND gate 18d. The output from the NAND gate 18d is applied to the first input end of the three-input NAND gate 18e. The output from the OR gate 18c is applied to the second input end of the NAND gate 18e. The output from the NAND gate 18e is applied to the other input end of the NAND gate 18d as well as to a data output terminal 8. The third input end of the NAND gate 18e is connected to the power source 12 through a resistor 21 as well as the ground through an N channel MOS transistor 22. The gate electrode of the MOS transistor 22 is connected to the power source 12. The substrate of the MOS transistor 22 is connected to the ground and the threshold voltage thereof is selected to be higher than the output voltage of the power source 12 on the occasion of the ordinary operation of the memory circuit 17.

Now, the operation of the embodiment of FIG. 6 will be described. While in the operational mode, the MOS transistor 22 is off, and consequently, the output voltage of the power source 12 is applied to the third input end of the NAND gate 18e through the resistor 21. In this state, the D type flip-flop 18 loads data inputted from the data input terminal 6 synchronously to store "0" or "1". Then, it outputs the stored content to the data output terminal 8. On this occasion, if the output voltage of the power source 12 is raised higher than the voltage at the ordinary operation, the MOS transistor 22 is turned on, and the third input end of the NAND gate 18e is pulled down to the ground potential. Consequently, the D type flip-flop is forced to initialize and be set.

Figure 7:
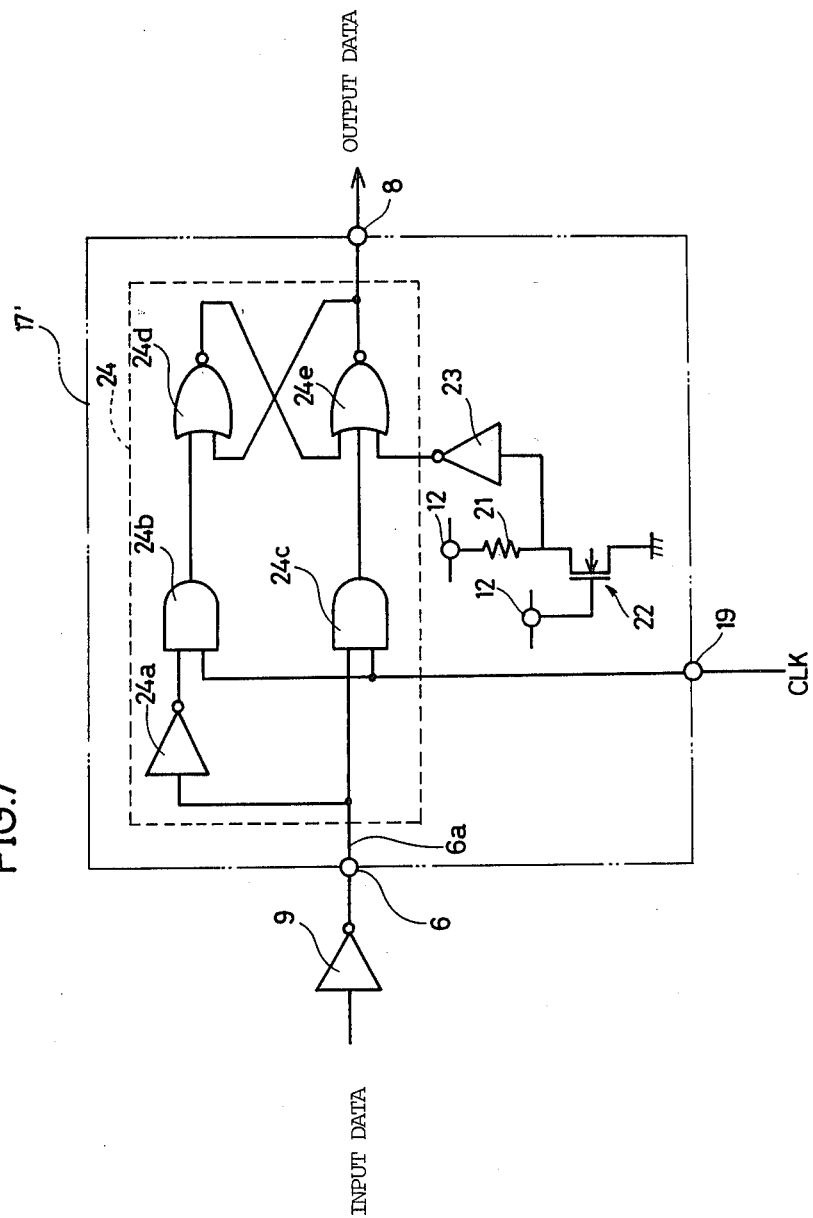

FIG. 7 is a schematic diagram of one embodiment of a memory circuit composed of a D type flip-flop having a resetting initialization function. Referring to the figure, the input data is applied to the data input terminal 6 of the memory circuit 17' through a driver 9. The input data from the data input terminal 6 is applied to the D type flip-flop 24 through the data input line 6a. The D type flip-flop 24 is composed of an inverter 24a, two AND gates 24b and 24c, and two NOR gates 24d and 24e. That is, the input data from the data input line 6a is applied to one input end of the AND gate 24b through the inverter 24a as well as to one input end of the AND gate 24c directly. A clock signal CLK inputted from a clock signal input terminal 19 is applied to the other input ends of these AND gates 24b and 24c. The output from the AND gate 24b is applied to one input end of the NOR gate 24d. The output from the NOR gate 24d is applied to the first input end of the three-input NOR gate 24e. The output from the AND gate 24c is applied to the second input end of the NOR gate 24e. The output from the NOR gate 24e is applied to the other input end of the NOR gate 24d as well as to a data output terminal 8. The third input end of the NOR gate 24e is connected to the output end of the inverter 23. The input end of the inverter 23 is connected to the power source 12 through a resistor 21 as well as to the ground through an N channel MOS transistor 22. The gate electrode of the MOS transistor 22 is connected to the power source 12. The substrate of the MOS transistor 22 is connected to the ground and the threshold voltage thereof is selected to be higher than the output voltage of the power source 12 in the operational mode of the memory circuit 17'.

The operation of the embodiment shown in FIG. 7 will be described. In the operatonal mode, the MOS transistor 22 is in an off state, and the output voltage of the power source 12 is inverted by the inverter 23 to be applied to the third input end of the NOR gate 24e. On the other hand, the clock signal CLK is applied to the other input ends of the AND gates 24b and 24c without inversion, so that the D type flip-flop 24 performs loading and storing of the input data synchronously with the clock signal CLK on this occasion. If the output voltage of the power source 12 is raised higher than the output voltage in the operational mode, the MOS transistor 22 turns off, and the potential at the third input end of the NOR gate 24e is pulled up by the function of the inverter 23 inverting the ground potential. Accordingly, the D type flip-flop 24 is forced to initialize be reset.

As described above, in the embodiments shown in FIGS. 6 and 7 setting and resetting initialization can be performed by merely raising the output voltage of the power source 12, without providing signal lines or input terminals for inputting set or reset initialization signals.

Meanwhile, in addition to the D type flip-flop, a RS flip-flop or a T type flip-flop may be used as a logic circuit.

Although the present invention has been described with reference to specific embodiments, it should be understood that these embodiments are examplary preferred embodiments and that modifications may be made without departing from the scope of the invention as defined in the appended claims.

What is claimed is:

1. A semiconductor memory device operable in an operating mode for storing data having a logic "1" or "0" value according to the input data, and being initializable to a predetermined initial logic value, comprising:
   a first reference potential source comprising a power source having an output selectively at an operating mode voltage output level and an initialization mode voltage output level;
   a second reference potential source of a ground potential;
   a data input terminal for supplying said input data to said logic circuit and to which said input data is applied;
   a logic circuit for performing a prescribed storing operation according to said input data and having an initialization terminal to cause said logic circuit to store a predetermined initial logic value is response to an initialization signal applied thereto;
   a data output terminal for supplying an output from said logic circuit; and an MOS transistor for supplying said initialization signal to said initialization terminal of said logic circuit in response to said initialization mode voltage output level of said power source, said MOS transistor having a first conduction electrode connected to said data input terminal of said logic circuit, a second conduction electrode connected to a one of said first and second reference potential sources, and having a gate electrode connected to a one of said first and second reference potential sources;

said MOS transistor having a fixed threshold voltage selected to be higher than said operating mode voltage output level and lower than said initialization mode voltage output level of said power source in said operating mode.

2. A semiconductor memory device according to claim 1, wherein said logic circuit comprises a latch circuit.

3. A semiconductor memory device according to claim 2, wherein said MOS transistor is an N channel MOS transistor having said first conduction electrode connected to said initialization terminal of said logic device, said second conduction electrode connected to said second reference potential source, and said gate electrode connected to said first reference source.

4. A semiconductor memory device according to claim 2, wherein said MOS transistor is an N channel MOS transistor having said first conduction electrode connected to said initialization terminal of said logic circuit, said second conduction electrode and said gate electrode connected to said first reference potential source.

5. A semiconductor memory device according to claim 2, wherein said MOS transistor is a P Channel MOS transistor having said first conduction electrode connected to said initialization terminal of said logic circuit, said second conduction electrode connected to said first reference potential source, and said gate electrode connected to said second reference potential source.

6. A semiconductor memory device according to claim 1, wherein said logic circuit comprises a flip-flop.

7. A semiconductor memory device according to claim 6, wherein said MOS transistor is an N channel MOS transistor having said first conduction electrode connected to said initialization terminal of said logic circuit and to said first reference potential source through a resistor, said second conduction electrode connected to said second reference potential source, and said gate electrode connected to said first reference potential source.

8. A semiconductor memory device according to claim 6, wherein said MOS transistor is an N channel MOS transistor having said first conduction electrode connected to said initialization terminal of said logic circuit through an inverter and to said first reference potential source through a resistor, said second conduction electrode connected to said second reference potential source, and said gate electrode connected to said first reference potential source.

9. A semiconductor memory device according to claim 1, wherein said data input terminal of said logic circuit is said initialization terminal of said logic circuit.

10. A semiconductor memory device according to claim 9, wherein said logic circuit comprises a latch circuit.

11. A semiconductor memory device according to claim 10, wherein said MOS transistor is an N channel MOS transistor having said first conduction electrode connected to said initialization terminal of said logic device, said second conduction electrode connected to said second reference potential source, and said gate electrode connected to said first reference source.

12. A semiconductor memory device according to claim 10, wherein said MOS transistor is an N channel MOS transistor having said first conduction electrode connected to said initialization terminal of said logic circuit and said second conduction electrode and said gate electrode connected to said first reference potential source.

13. A semiconductor memory device according to claim 10, wherein said MOS transistor is a P channel MOS transistor having said first conduction electrode connected to said initialization terminal of said logic circuit said second conduction electrode connected to said first reference potential source, and said gate electrode connected to said second reference potential source.

* * * * *